(12) United States Patent
Almagro et al.

(10) Patent No.: US 11,791,247 B2
(45) Date of Patent: Oct. 17, 2023

(54) CONCEALED GATE TERMINAL SEMICONDUCTOR PACKAGES AND RELATED METHODS

(71) Applicant: SEMICONDUCTOR COMPONENTS INDUSTRIES, LLC, Phoenix, AZ (US)

(72) Inventors: Erwin Ian Vamenta Almagro, Lapu-Lapu (PH); Maria Clemens Ypil Quinones, Cebu (PH); Romel N. Manatad, Liloan (PH); Maria Cristina Estacio, Lapu-Lapu (PH); Elsie Agdon Cabahug, Consolacion (PH)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 7 days.

(21) Appl. No.: 17/305,396

(22) Filed: Jul. 7, 2021

(65) Prior Publication Data
US 2022/0102248 A1 Mar. 31, 2022

Related U.S. Application Data

(60) Provisional application No. 63/085,770, filed on Sep. 30, 2020.

(51) Int. Cl.
*H01L 23/495* (2006.01)
*H01L 23/31* (2006.01)
*H01L 23/522* (2006.01)

(52) U.S. Cl.
CPC ........ *H01L 23/49541* (2013.01); *H01L 23/31* (2013.01); *H01L 23/5226* (2013.01)

(58) Field of Classification Search
CPC .............. H01L 23/49541; H01L 23/31; H01L 23/5226
USPC .......................................................... 257/676
See application file for complete search history.

(56) References Cited

U.S. PATENT DOCUMENTS

| 9,214,417 | B2 * | 12/2015 | Ho ..................... H01L 23/49503 |
| 2005/0006737 | A1 * | 1/2005 | Islam .................. H01L 21/4832 257/676 |
| 2005/0236708 | A1 * | 10/2005 | Farnworth ........... H04N 5/2253 257/723 |
| 2013/0256852 | A1 | 10/2013 | Wyant et al. |
| 2014/0061884 | A1 | 3/2014 | Carpenter et al. |

(Continued)

*Primary Examiner* — Tu-Tu V Ho
(74) *Attorney, Agent, or Firm* — Adam R. Stephenson, LTD.

(57) ABSTRACT

Semiconductor packages may include a lead frame, one or more semiconductor die coupled with the lead frame, and an interposer coupled with the lead frame and with at least one of the one or more semiconductor die. The interposer in implementations includes an electrically conductive material coupled with an electrically insulative material. The interposer may be coupled with the lead frame through the electrically insulative material such that the electrically conductive material is electrically isolated from the lead frame. The interposer may facilitate a gate node of the package being fully encapsulated within the package without being exposed through an encapsulant of the package. Fully encapsulating the gate node within the package may allow a contact pad of another node to have a larger area exposed through the encapsulant to provide greater heat transfer to a printed circuit board (PCB).

20 Claims, 11 Drawing Sheets

(56) References Cited

U.S. PATENT DOCUMENTS

| | | | |
|---|---|---|---|
| 2014/0191378 A1* | 7/2014 | Lee | H01L 23/49838 |
| | | | 257/668 |
| 2015/0243589 A1* | 8/2015 | Ho | H01L 24/40 |
| | | | 257/329 |
| 2021/0035961 A1* | 2/2021 | Lim | H01L 23/49822 |
| 2021/0313284 A1* | 10/2021 | Noori | H01L 25/072 |

* cited by examiner

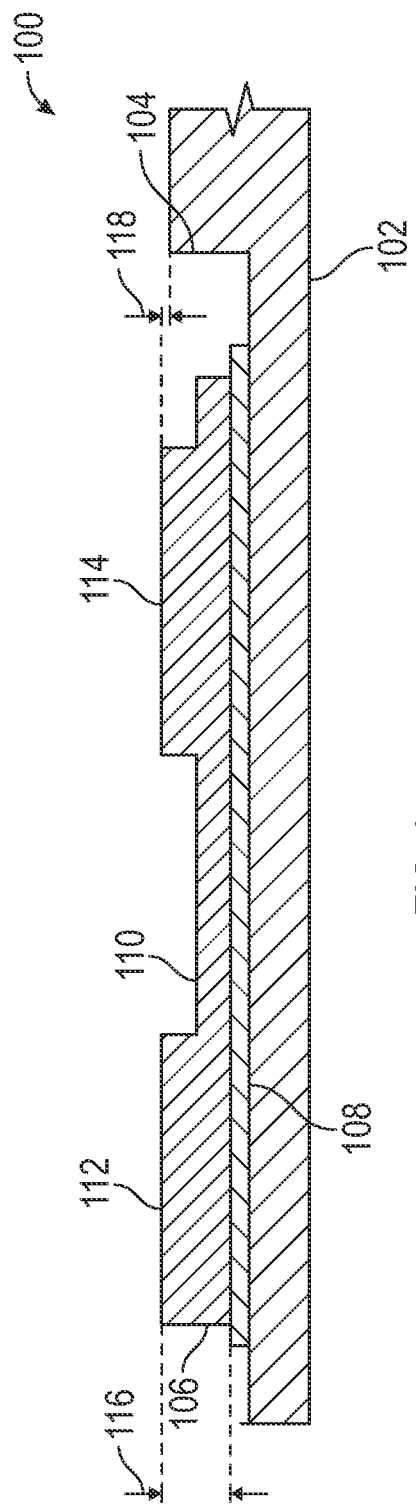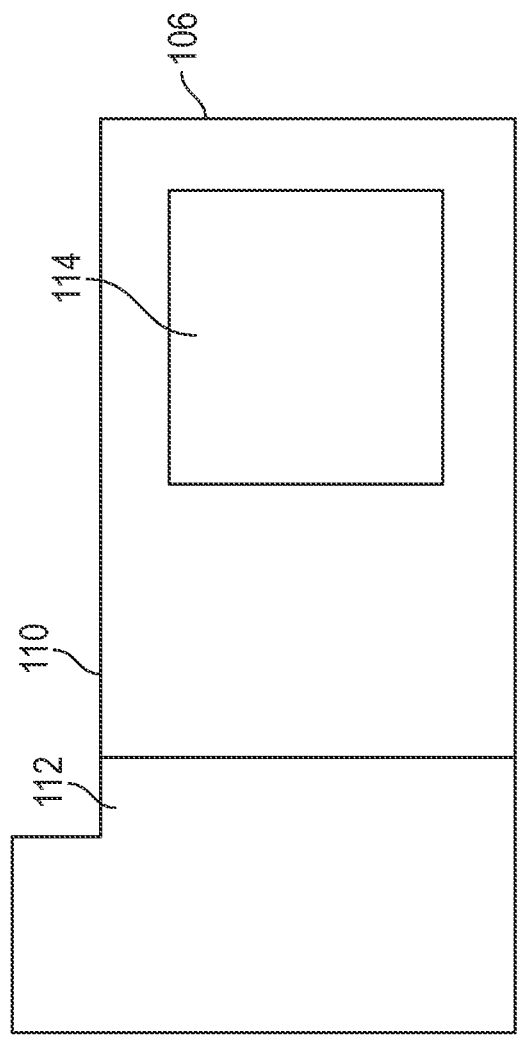

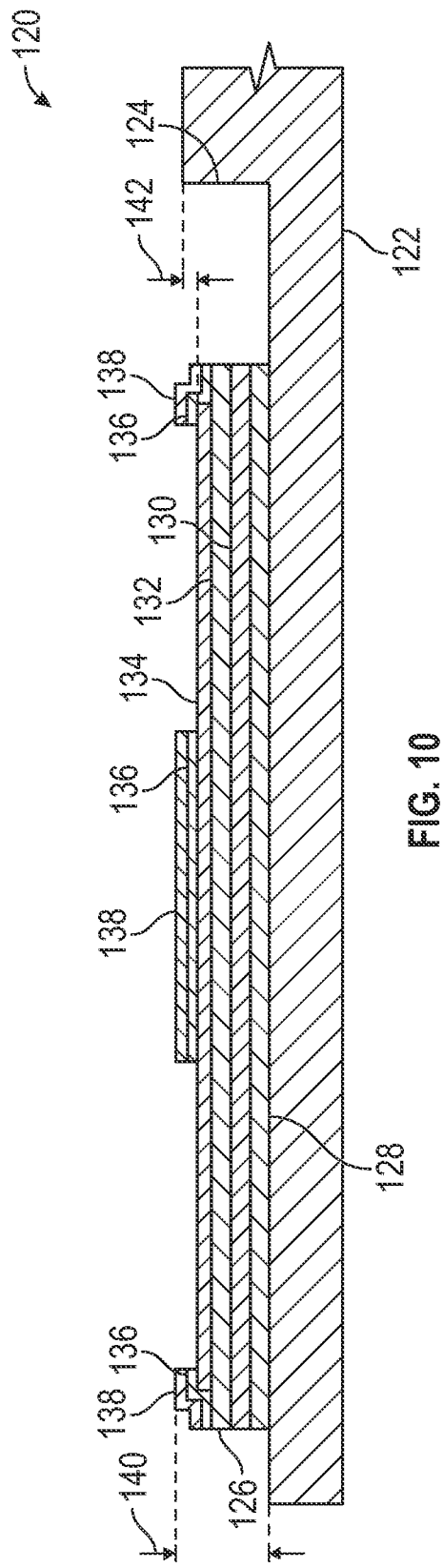
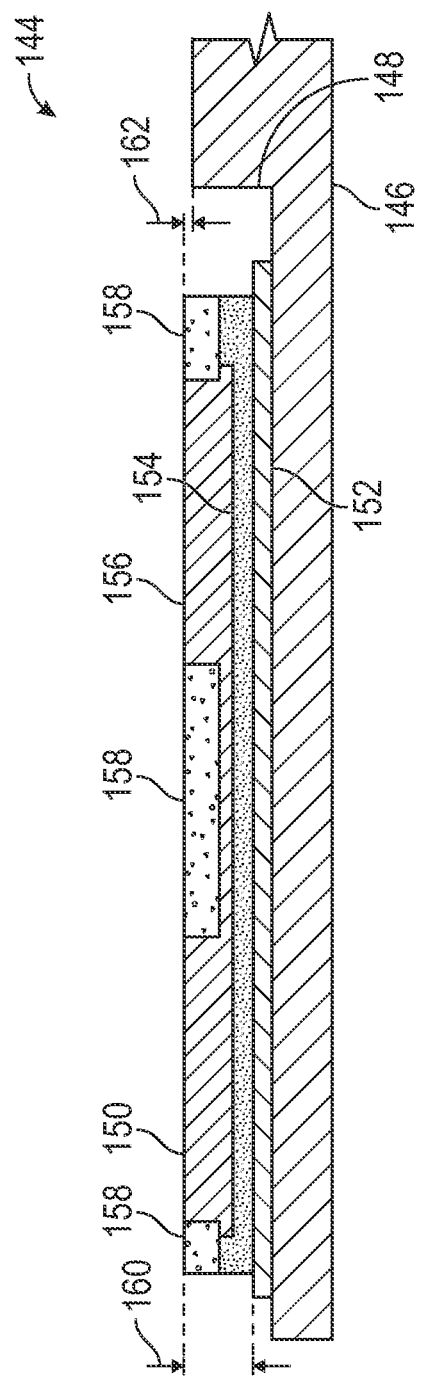
FIG. 10
FIG. 11

CONCEALED GATE TERMINAL SEMICONDUCTOR PACKAGES AND RELATED METHODS

CROSS REFERENCE TO RELATED APPLICATIONS

This document claims the benefit of the filing date of U.S. Provisional Patent Application 63/085,770, entitled "Concealed Gate Terminal Packaging" to Erwin Ian Vamenta Almagro et al., which was filed on Sep. 30, 2020, the disclosure of which is hereby incorporated entirely herein by reference.

BACKGROUND

1. Technical Field

Aspects of this document relate generally to semiconductor packages that include one or more die. More specific implementations involve semiconductor packages including an interposer and one or more concealed gate terminals.

2. Background

Semiconductor packages include one or more die that are at least partially encapsulated within an encapsulant. Contacts of the die (or contacts that are coupled with the die) are often exposed through the encapsulant for thermal and/or electrical connections, such as for power, grounding, signals, and heat transfer. For example, a metal-oxide-semiconductor field-effect transistors (MOSFET) may be flip chip mounted within a package so that a source pad of the MOSFET is directly coupled with a printed circuit board (PCB) (such as through solder or the like).

SUMMARY

Implementations of semiconductor packages may include: a lead frame; one or more semiconductor die coupled with the lead frame; and an interposer coupled with the lead frame and with at least one of the one or more semiconductor die; wherein the interposer includes an electrically conductive material on a first side of the interposer and an electrically insulative material on a second side of the interposer; and wherein the interposer is coupled with the lead frame through the electrically insulative material such that the electrically conductive material is electrically isolated from the lead frame.

Implementations of semiconductor packages may include one, all, or any of the following:

The electrically conductive material may form at least two contact pads separated using one of a recess and a raised portion.

The interposer may be coupled with the lead frame using an adhesive, an epoxy, and/or a solder.

The electrically insulative material may include silicon, polyimide, an epoxy, a mold compound, and/or a ceramic.

The electrically conductive material may include a copper slug.

The interposer may include or may form a flexible tape.

The interposer may include or may form a flexible printed circuit board.

The interposer may include or may form a molded integrated substrate.

At least one gate node of a transistor of the one or more semiconductor die may be fully enclosed within an encapsulant of the package without the gate node being exposed through the encapsulant.

A source pad of the package may be exposed through the encapsulant and electrically coupled with a source node of the transistor and may have an increased size relative to a source pad of a package having the at least one gate node exposed through the encapsulant.

A source pad of the package exposed through the encapsulant and electrically coupled with a source node of the transistor may have an increased heat transfer rate relative to a source pad of a package having the at least one gate node exposed through the encapsulant.

A gate node of one of the one or more semiconductor die may be electrically coupled with a driver of the one or more semiconductor die without using a through-silicon via (TSV).

Implementations of methods of forming a semiconductor package may include: providing a lead frame; coupling one or more semiconductor die with the lead frame; mechanically coupling an interposer with the lead frame and electrically coupling the interposer with at least one of the one or more semiconductor die; at least partially enclosing the lead frame with an encapsulant, the one or more semiconductor die and the interposer within the encapsulant forming an unsingulated array; and singulating the array to form a semiconductor package; wherein the interposer includes an electrically conductive material on a first side of the interposer and an electrically insulative material on a second side of the interposer; and wherein the interposer is coupled with the lead frame through the electrically insulative material such that the electrically conductive material is electrically isolated from the lead frame.

Implementations of methods of forming a semiconductor package may include one, all, or any of the following:

The interposer may be fully encapsulated within the encapsulant without being exposed through the encapsulant after singulation.

The method may include fully enclosing at least one gate node of a transistor of the one or more semiconductor die within the encapsulant without the gate node being exposed through the encapsulant after singulation.

The method may include exposing a source pad through the encapsulant where the source pad is electrically coupled with a source node of the transistor and where the source pad may have an increased size relative to a source pad of a package having the at least one gate node exposed through the encapsulant.

The method may include exposing a source pad through the encapsulant where the source pad may be electrically coupled with a source node of the transistor and where the source pad having an increased heat transfer rate relative to a source pad of a package having the at least one gate node exposed through the encapsulant.

The method may include electrically coupling a gate node of the one or more semiconductor die with a driver of the one or more semiconductor die without using a through-silicon via (TSV).

Implementations of semiconductor packages may include: a lead frame; at least one transistor coupled with the lead frame; at least one driver coupled with the lead frame; an electrical interconnect electrically interconnecting the at least one driver with a gate node of the at least one transistor using only an interposer; and an encapsulant at least partially encapsulating the lead frame, the at least one transistor, the at least one driver, and the electrical interconnect; wherein the gate node is fully encapsulated within the encapsulant.

Implementations of semiconductor packages may include one, all, or any of the following:

The interposer may include an electrically conductive material coupled with an electrically insulative material, wherein the at least one driver is electrically coupled with the gate node through the electrically conductive material, and wherein the electrically insulative material electrically insulates the electrically conductive material from the lead frame.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 8 is a cross-section view of elements of a semiconductor package;

FIG. 9 is a top view of an interposer;

FIG. 10 is a cross-section view of elements of a semiconductor package;

FIG. 11 is a cross-section view of elements of a semiconductor package;

DESCRIPTION

This disclosure, its aspects and implementations, are not limited to the specific components, assembly procedures or method elements disclosed herein. Many additional components, assembly procedures and/or method elements known in the art consistent with the intended concealed gate terminal semiconductor packages and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such concealed gate terminal semiconductor packages and related methods, and implementing components and methods, consistent with the intended operation and methods.

Some semiconductor packages include multiple semiconductor devices. For example, referring to FIG. 1, a top view of a footprint of semiconductor package 2 is shown. Package 2 includes a low side metal-oxide-semiconductor field-effect transistor (MOSFET), a high side MOSFET, a driver integrated circuit (IC), and various passives all at least partially encapsulated within an encapsulant 4. Leads/contacts 6 of the MOSFETs, driver, and so forth—or leads/contacts which couple with the MOSFETs, driver, and so forth—are exposed through the encapsulant for electrical and/or thermal coupling with other elements, such as by coupling with a printed circuit board (PCB). The leads may accordingly be used for electrical purposes, such as providing power, electrical grounding, the transmission of signals, and/or for heat transfer, such as to draw heat away from the package and its devices and into the PCB to extend the life of the package.

Figure 1:
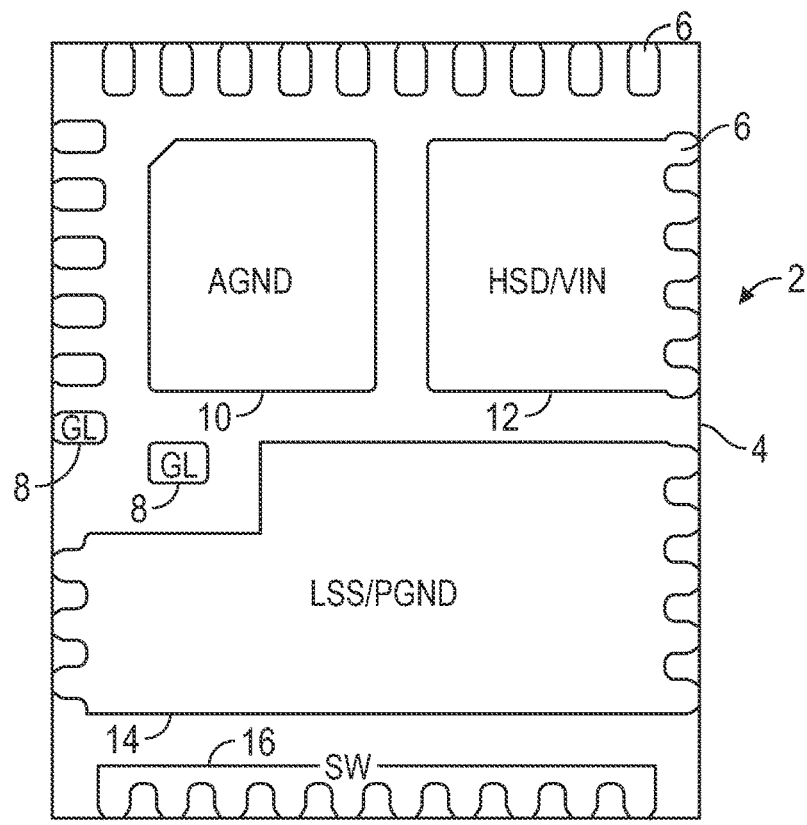
FIG. 1 is a top view of a footprint of a semiconductor package.

FIG. 1 reveals that the leads include gate leads 8, an analog ground (AGND) lead 10 (which may in implementations be a signal ground), a high side drain (HSD) or input voltage (VIN) lead 12, a low side source (LSS) or power ground (PGND) lead 14, and a switch node contact (SW) lead 16. In implementations a driver IC couples over the AGND pad, a high side MOSFET die couples over the HSD pad, and a low side MOSFET die (flip chip) couples over the LSS pad. Although multi-chip packages may include other devices, such as insulated-gate bipolar transistors (IGBTs) instead of MOSFETs, the example of a multi-chip package using MOSFETs will be used herein throughout as just one example among many possible using the principles disclosed herein.

A multi-chip semiconductor package may accordingly, in implementations, include a low side MOSFET, a high side MOSFET, a driver IC, passives, and/or other elements. During operation of such a package, the drain and source paths of the MOSFETs (HSD/LSS) heat up more than the other paths. This can detrimentally affect the overall performance of the package. One way to address this is to increase exposed pad areas along the drain and source paths to increase heat transfer to the PCB. Flip chip mounting of a MOSFET, such as the low side MOSFET of the package of FIG. 1, allows for directly coupling the source pad (LSS) with the PCB. This can increase heat transfer from the source pad to the PCB traces to reduce heating of the package. In such a flip chip configuration, however, the gate leads 8 are coplanar with the source pad (LSS) and so occupy space within the footprint, as seen in FIG. 1. This limits heat transfer from the source pad LSS to the PCB because it limits the size of the source pad. Described herein are semiconductor packages and methods which have concealed gate pads/terminals or, in other words, packages wherein the gate leads/terminals are not exposed through the encapsulant, thus allowing for increased source pad sizes. The increased surface area of the source pads allows for improved thermal performance of the semiconductor packages during operation. Such modified package designs can also improve PCB layout designs.

Referring still to FIG. 1, the two gate lead (GL) pins occupy an area on the footprint of the package. The gate lead pins, however, do not need to be exposed through the encapsulant provided that a connection between the low side gate and the IC driver is established within the encapsulant.

Figure 2:
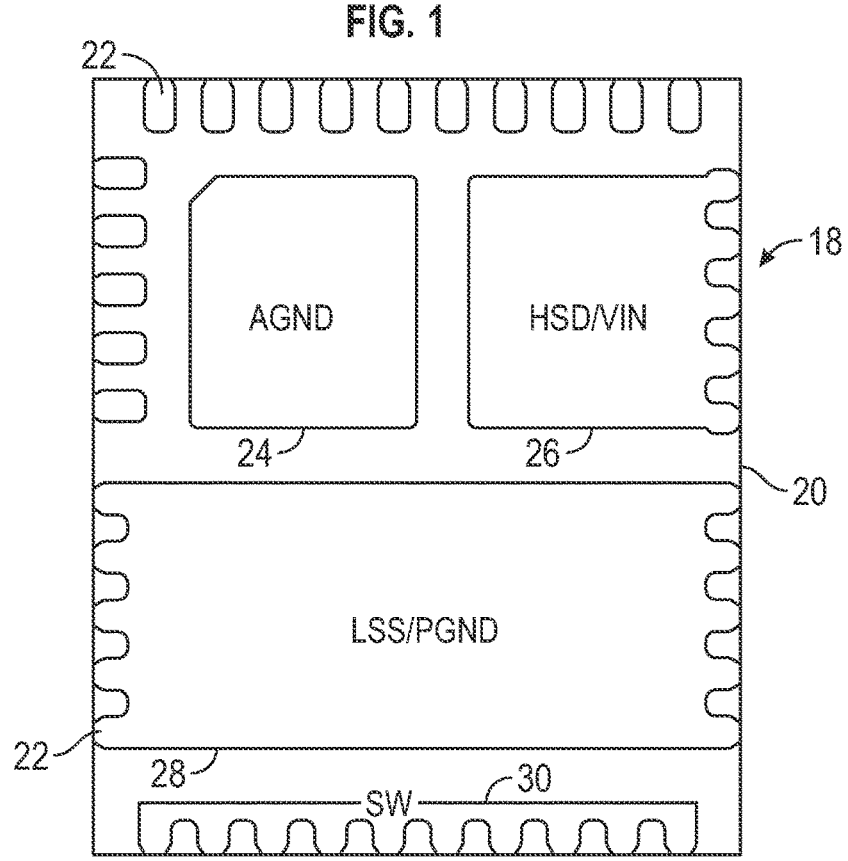
FIG. 2 is a top view of a footprint of a semiconductor package.
Figure 3:
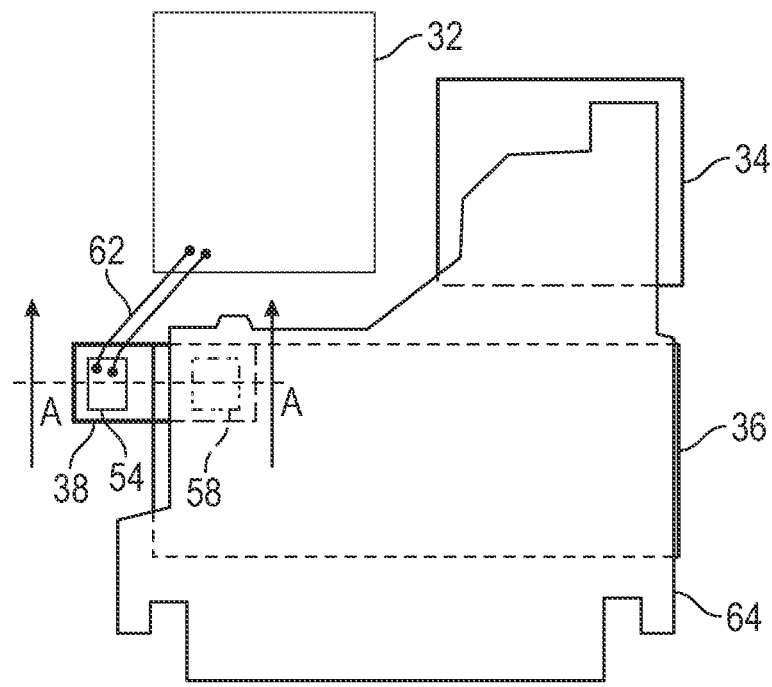
FIG. 3 is a top partial see-through view of elements of the package of FIG. 2.
Figure 4:
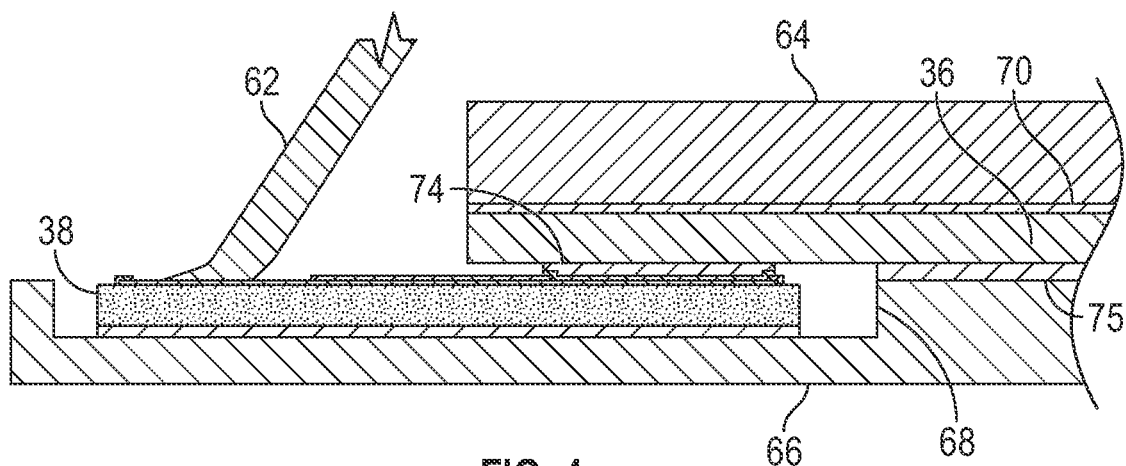
FIG. 4 is a cross-section view of some of the elements of FIG. 3 taken along line A-A.

Referring now to FIGS. 2-4, a second implementation of a semiconductor package 18 is illustrated. FIG. 2 shows a top view of a footprint of the package. Package 18 is similar to package 2 in that it is a multi-chip module (MCM) including a driver/controller IC die 32, a high side MOSFET die 34, and a low side MOSFET die 36 each at least partially encapsulated within an encapsulant 20. Leads/contacts 22 of the die 32/34/36 (or leads/contacts coupled with the die 32/34/36) are exposed through the encapsulant, including an analog ground (AGND) lead 24 (which may be a signal ground), a high side drain (HSD) or input voltage (VIN) lead 26, a low side source (LSS) or power ground (PGND) lead 28, and a switch node (SW) lead 30.

FIG. 3 shows elements of package 18 with some elements not shown. In FIG. 3 the placement of the driver IC die (driver) 32, high side MOSFET die (HS MOSFET) 34, and low side MOSFET die (LS MOSFET) 36 are shown. The LS MOSFET is in a flip chip configuration. A low side gate interposer (interposer) 38 is seen underneath the LS MOSFET and has two contact pads 54/58. One of these (pad 58) is facing up (out of the page) and is electromechanically coupled with the underside of the LS MOSFET, while the other (pad 54) also faces up (out of the page) and is coupled with the driver using electrical couplers 62. In the drawings the electrical couplers 62 are wirebonds, but in other implementations a clip or other electrical coupler could be used. A switch node (SW) clip (drain clip) 64 is positioned over the HS MOSFET and LS MOSFET and is electromechanically coupled to both. The SW clip is also positioned over, and is electromechanically coupled with, the SW lead 30, which is not shown in FIG. 3.

The use of the interposer 38 to electromechanically couple with the LS MOSFET, and also to electrically couple with the driver, allows the gate leads/terminals to be concealed in the sense that no gate leads need be exposed through the encapsulant 20. The cross section of FIG. 4 is taken along line A-A of FIG. 3. Cross sections of components of other packages, such as in FIGS. 7-8 and 10-13, are represented as if also taken along line A-A of those respective packages—an in each case some elements are omitted for ease of viewing the shown elements.

Referring now to FIGS. 3-4, lead frame 66 has been etched (half-etched, in implementations) to form a recess 68 and interposer 38 is situated within the recess. The lead frame in the drawings is formed of copper or a copper alloy, but in other implementations it could be formed of other materials such as, by non-limiting example, an iron nickel alloy, a steel, copper, aluminum, or another electrically conductive material. In implementations the recess may be formed using any material removal techniques other than etching like stamping, punching, or pressing, or the lead frame may be initially formed with the recess integrally formed therein. The interposer may include of any of a wide variety of electrically insulative materials such as, by non-limiting example, silicon, polysilicon, polymers/plastics, a resin, a glass, a ceramic, aluminum nitride, silicon dioxide, silicon nitride, a composite material, any combination thereof, and any other material disclosed herein, or any other electrically insulative material. The interposer is disposed on a low-side source base portion of the lead frame but electrically isolates the gate interconnects from the lead frame. The gate interconnects between the driver and the LS MOSFET are effectively formed using the wirebonds (or other electrical couplers), one or more conductive portions of the interposer, one or more solders or other electromechanical couplers, and so forth.

Figure 5:
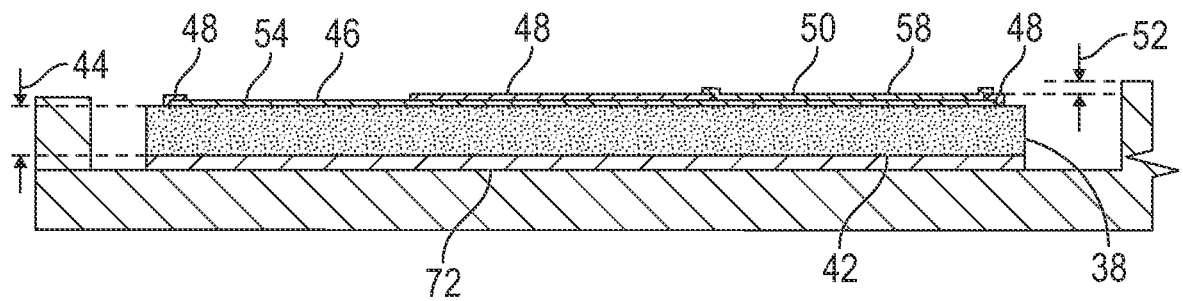
FIG. 5 is a close-up view of some of the elements of FIG. 4.

As illustrated in FIG. 5, layer 72 mechanically couples the interposer with the lead frame. Layer 72 may be, by non-limiting example, a solder or an adhesive. Interposer 38 includes layer 42 which is formed of an electrically insulative material. In the drawings layer 42 is formed of silicon and has a thickness 44 of 0.076 in., though in other implementations other thicknesses could be used. Interposer 38 also includes layer 46 disposed over layer 42, layer 48 disposed over layer 46 and two openings formed in layer 48, and layer 50 disposed over one of the openings. Layer 46 is formed of an electrically conductive material, such as a metal, metal alloy, conductive epoxy, or other electrically conductive material. In the shown implementation it is formed of an aluminum (Al) top metal. Layer 48 is formed of an electrically insulative material, such as a photosensitive polyimide (PSPI) or another selectively patternable/etchable material. Layer 48 is patterned and selectively etched to form two openings—one of these can be seen in FIG. 6, as contact/pad 54 is exposed through one of the openings. Contact 54, which is essentially layer 46 exposed through this opening, in implementations forms a wirebondable metallized pad to facilitate a wirebond connection between the gate of the LS MOSFET and the driver.

Figure 6:
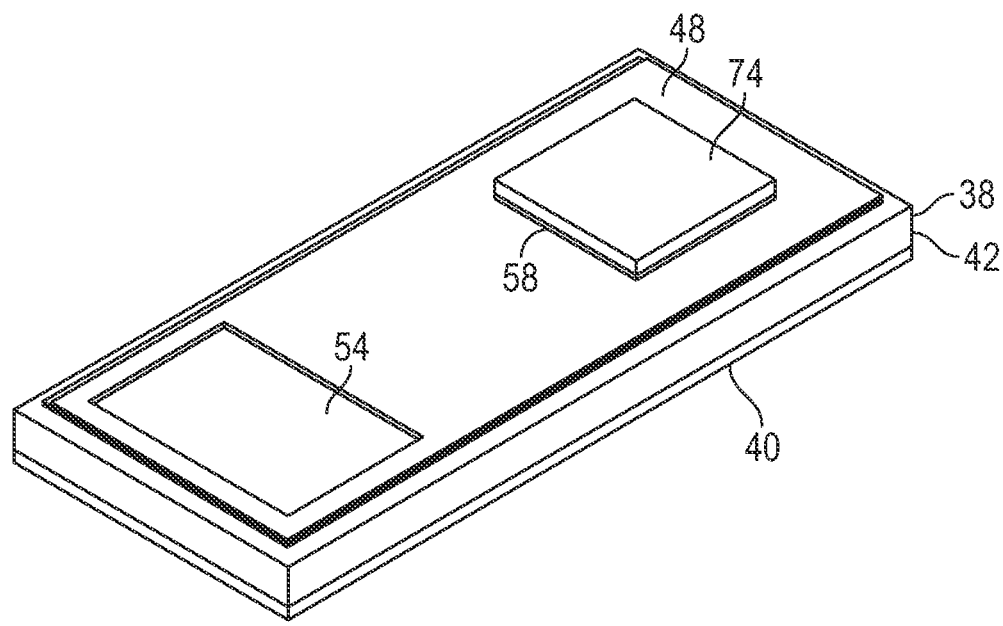
FIG. 6 is a top perspective view of an interposer.

The other opening is covered with contact/pad 58. Layer 50 (which forms contact 58) is formed of a solderable top metal (STM). In FIG. 6, contact 58 is a solderable metallized pad shown and is covered with layer 74. Layer 74 is a solder in the drawings, and may be referred to as a low side (LS) gate solder. In other implementations layer 74 could be something other than a solder, such as an electrically conductive tape or other electromechanical coupling. Layer 74 is used to electromechanically couple the interposer with the LS MOSFET, as seen in FIG. 4. Layer 74 may, for example, be electromechanically coupled with a gate STM pad of the LS MOSFET. The interposer in implementations also includes layer 40, seen in FIG. 6 but not shown in FIGS. 4-5. Layer 40 is a solderable back metal which is useful for mechanically coupling the interposer with the lead frame if layer 72 is formed of a solder. If an adhesive or other mechanical coupling is used, layer 40 may be omitted. FIG. 5 shows that a distance 52 of 0.006 in. exists between a top surface of the lead frame and the largest planar surface of layer 50—in other implementations other distances could be used, but forming the interposer so that its upper surface is nearly coplanar with the upper surface of the etched lead frame may allow for ease of assembly of the package and easy placement of remaining package components. FIGS. 5-6 show that layer 48 forms a non-conductive surface between the contacts 54/58. In implementations layer 48 could simply be a passivation layer of layer 46. For example, an aluminum layer 46 could be exposed to oxygen to form a passivation layer and then portions of the passivation layer could be selectively removed to form the openings using a PSPI and etching/material removal techniques, the PSPI later fully removed.

Layer 48 is useful in that it helps to prevent flux and solder bleed out from the gate solder joint (between contact 58 and the LS MOSFET), thus preventing contamination of the wirebond metallization. The spacing between pads 54/58 may also be such as to prevent wirebond capillary crash onto the clip-bonded LS MOSFET.

Other layers are shown in FIG. 4. Layer 70 is used to electromechanically couple the SW clip with the LS MOSFET. Layer 70 is a solder in the drawings, and may be referred to as a low side (LS) drain solder. In other implementations, layer 70 could be something other than a solder, such as an electrically conductive tape or other electromechanical coupling. Layer 75 is used to electromechanically couple the lead frame with the LS MOSFET. Layer 75 is a solder in the drawings, and may be referred to as a low side (LS) source solder. In other implementations layer 75 could be something other than a solder, such as an electrically conductive tape or other electromechanical coupling.

The interposer allows electrical connections to be formed on a top side of the interposer where the electrical connections are electrically insulated from the lead frame. In some implementations, the interposer may include one or more traces. The effect of forming the electrical routing and bonding on the top side of the interposer is that from the outside of the package (as illustrated with the two footprint view of FIG. 2) the gate leads do not need to be exposed through the encapsulant, so the LSS lead can extend all the way across the package from one side to an opposing side. This increase in size or exposed surface area of the LSS lead has the effect of improving the thermal transfer of the package to traces of a PCB to which the package will be coupled. Although the LSS lead is seen having "fingers" at the left and right distal ends, in implementations these could be omitted and the LSS lead could simply have a rectangular shape extending from the left edge of the package to the right edge of the package to increase heat transfer even further.

Although the interposer examples shown in the drawings relate to the LS MOSFET gate, similar configurations could be used for the HS MOSFET gate when the HS MOSFET is in a flip chip configuration. The methods and configurations disclosed herein may be used in any situation in which the gate leads do not need to be exposed through the encapsulant.

Figure 7:
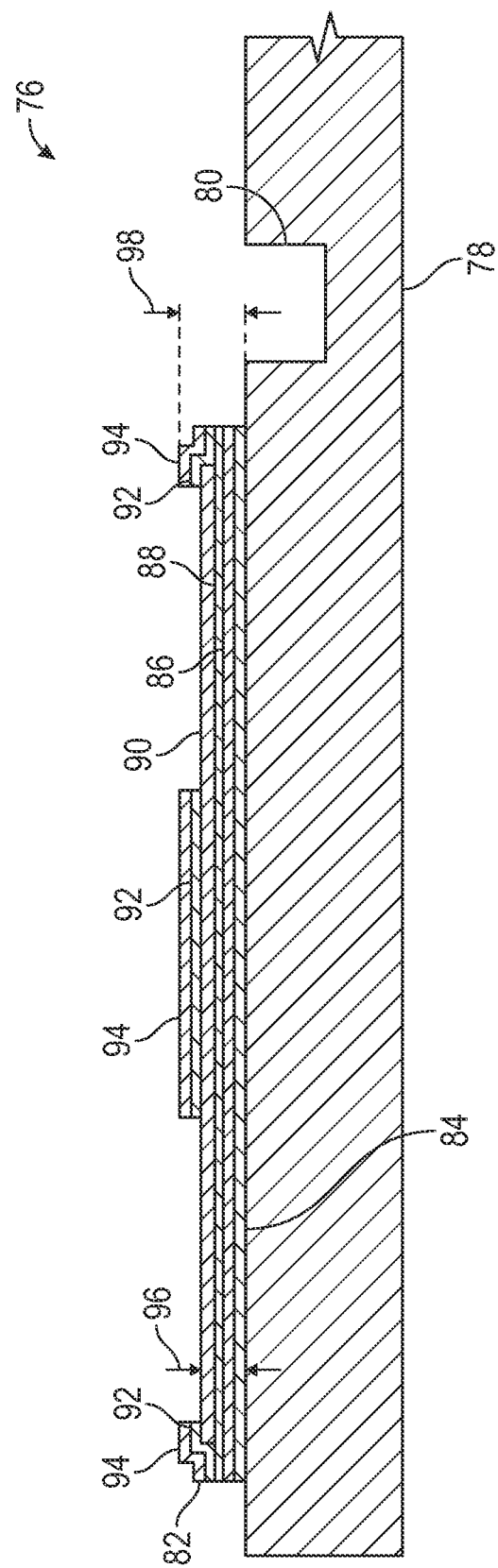
FIG. 7 is a cross-section view of elements of a semiconductor package.

A wide variety of interposer designs, materials, and techniques may be employed in various package implementations. Referring to FIG. 7 assembly 76 includes a lead frame 78 having a recess 80 and, proximate the recess, interposer 82. Recess 80 can function to electrically isolate the gate joint from the leadframe when filled with encapsulant following encapsulation in various implementations. Interposer 82 is formed of a flexible tape which includes a lower adhesive layer 84, a lower polyimide layer 86 (though another electrically insulative material could be used), a middle adhesive layer 88, a copper layer 90 (though a copper alloy or another electrically conductive material could be used), a top adhesive layer 92, and a top polyimide layer 94 (though another electrically insulative material could be used). Openings are formed through the top polyimide layer and the top adhesive layer to expose contact areas, as with interposer 38. Interposer 82 is adhered to the lead frame. In this implementation, the interposer may not need to be situated within a recess of the lead frame because the interposer may be very thin—for example interposer 82 may have a first thickness 96 of 0.057 in. and a second thickness 98 of 0.083 in. (though in other implementations other thicknesses may be used). Metallization may be included on top of the exposed pads of the copper (or conductive) layer before soldering and/or wirebonding, to facilitate soldering and/or wirebonding, and may include noble metal top metals such as electroless nickel immersion gold (ENIG) or the like.

FIG. 8 shows an assembly 100 which includes a lead frame 102 having a half-etched recess 104 and, within the recess, an interposer 106. FIG. 9 shows a top view of the interposer 106. A nonconductive layer 108, which in the shown implementation is an epoxy but which may be another polymer or other electrically non-conductive material in other implementations, mechanically couples the interposer to the lead frame. The interposer is formed of layer 110 which in the illustrated implementation is a copper slug (in other implementations it may be a slug formed of a copper alloy or another metal or electrically conductive material). Layer 110 includes raised portions 112 and 114 and a recessed portion between the raised portions and surrounding raised portion 114. The raised portions and the recesses between them help to prevent issues from flux and solder bleed out, as described above for other interposers. The interposer has a thickness 116 of 0.100 in. and a distance 118 between the top of the raised portions and the top of the lead frame of 0.012 in. (though in other implementations other thicknesses and distances could be used). Layer 110 may be silver (Ag) plated at its top surface (or only at the top surfaces of the raised portions) to facilitate soldering and wirebonding. The recessed portion of layer 110 may formed by etching or by another material removal technique.

Referring to FIG. 10, assembly 120 is shown which includes a lead frame 122 having a half-etched recess 124 and an interposer 126 situated therein. Interposer 126 is a flexible layered PCB which includes metallization and passivation layers/areas. A lower adhesive 128 (which in the implementation shown is electrically insulative, but in other implementations need not be) is used to couple the interposer to the lead frame. The interposer includes a lower insulative layer 130 (which may be polyimide or another insulative material), a middle adhesive layer 132, an electrically conductive layer 134 (which may be copper, a copper alloy, or another electrically conductive material), a top adhesive layer 136, and a top insulative layer 138 (which may be polyimide or another insulative material). Openings are formed in the top insulative layer and top adhesive layer to expose the contact pads, and the raised portion and the distance between the contact pads helps to prevent flux and solder bleed out contamination, as with other interposers. The interposer has a thickness 140 of about 0.122 in. and a distance 142 between the metal pads and the upper surface of the lead frame of about 0.018 in., though in other implementations other thicknesses and distances may be used. In implementations the lower insulative layer may have an internal substrate material coupled over it and the electrically conductive layer may be coupled over the internal substrate material.

Referring to FIG. 11, assembly 144 is shown which includes a lead frame 146 having a half-etched recess 148 within which interposer 150 is situated. Layer 152 is used to couple the interposer with the lead frame and may be, for example, a non-conductive epoxy. A lower mold compound layer 154 is coupled with layer 152 and a copper layer 156 or copper slug is coupled atop layer 154. Layer 156 is etched (or anther material removal technique is used) to form a recess therein. An upper mold compound layer 158 is coupled over layer 156 and contact pads are exposed therethrough (either by preventing the upper mold compound layer from covering the contact pads or by later removing it therefrom). Interposer 150 includes a thickness 160 of about 0.100 in. and a distance 162 between the upper surface of the interposer and the upper surface of the lead frame of about 0.012 in., though in other implementations other thicknesses and distances could be used. Interposer 150 forms a molded interconnect substrate (MIS). The mold compounds are electrically insulative. The upper mold compound helps provide electrical insulation between the two pad regions of layer 156.

Figure 12:
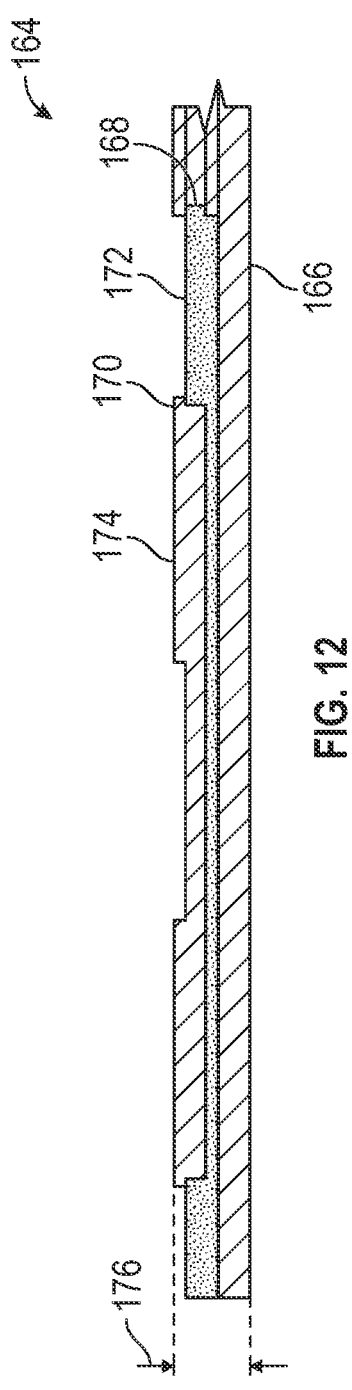
FIG. 12 is a cross-section view of elements of a semiconductor package.

Referring to FIG. 12, assembly 164 includes a lead frame 166 having a half-etched recess 168 and an interposer 170 coupled therein. Interposer 70 is a two layer substrate. In this implementation layer 172 is formed of an electrically insulative epoxy mold compound (EMC) and is deposited within the recess, while layer 174 (which may be copper or another electrically conductive material) is situated within a recess of the mold compound. Layer 174 includes two raised pads and a recess therebetween for preventing flux and solder bleed as with other interposers. Interposer 170 includes a thickness 176 of about 0.120 in., though in other implementations other thicknesses could be used.

Figure 13:
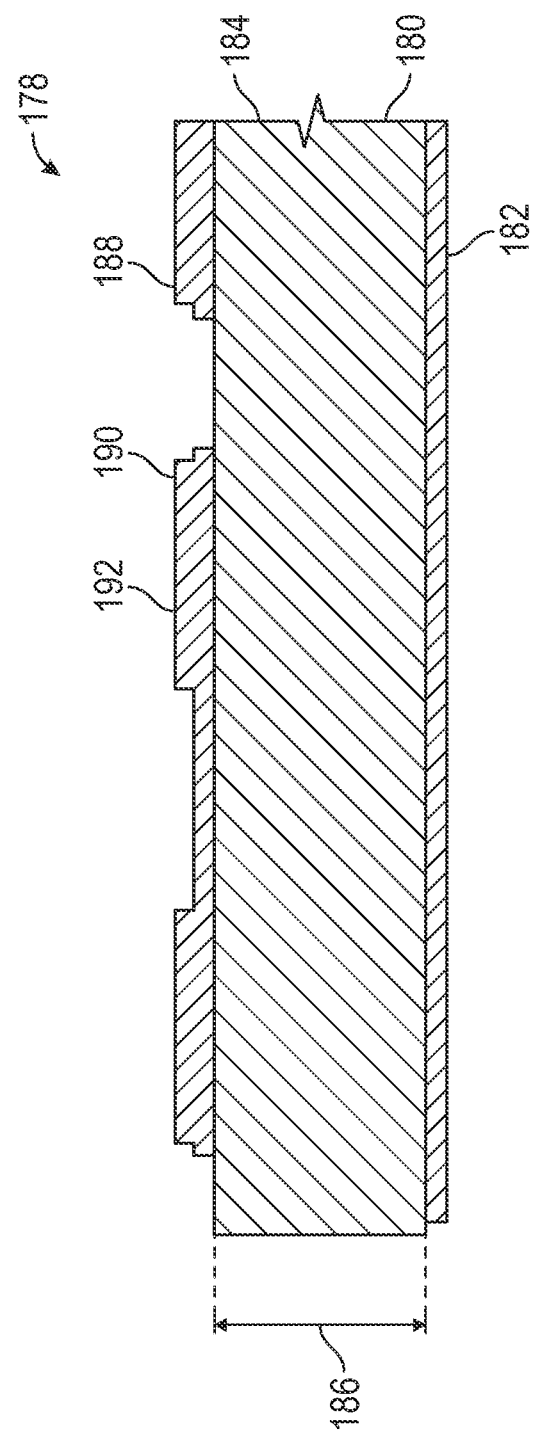
FIG. 13 is a cross-section view of elements of a semiconductor package.

Referring to FIG. 13, assembly 178 includes a lead frame 180 which is a metal-insulator-metal substrate having a layer 182 formed of metal (in this example copper, though other metals and metal alloys could be used), a layer 184 formed of an insulator (in this example a ceramic material, though other insulators could be used), and a layer 188 formed of an electrically conductive material (in this example copper, though other metals could be used). Interposer 190 is formed by a layer 192 of an electrically conductive material (in this example copper, though other metals could be used) that is coupled with layer 184 but which is electrically isolated from layer 188. Layer 184 has a thickness 186 of about 0.381 in., though other thicknesses could be used. Layer 192 includes to raised portions/pads with a recess in between for similar flux/solder bleed protection as other interposers.

In various implementations, layers 182/184/188 are not part of a lead frame but are portions of an interposer that are coupled within a half-etched recess of an interposer. For example, the interposer may include a ceramic substrate that includes a pattern in a copper layer on a top side that forms to pad regions, and a copper layer on a bottom side which is used to bond to the material of the lead frame (such as using a solder or the like).

A wide variety of different interposer designs formed of by non-limiting example, layers, substrates, tapes, die, silicon, any combination thereof, or any other material capable of functioning as an interposer may be used in various implementations.

Figure 14:
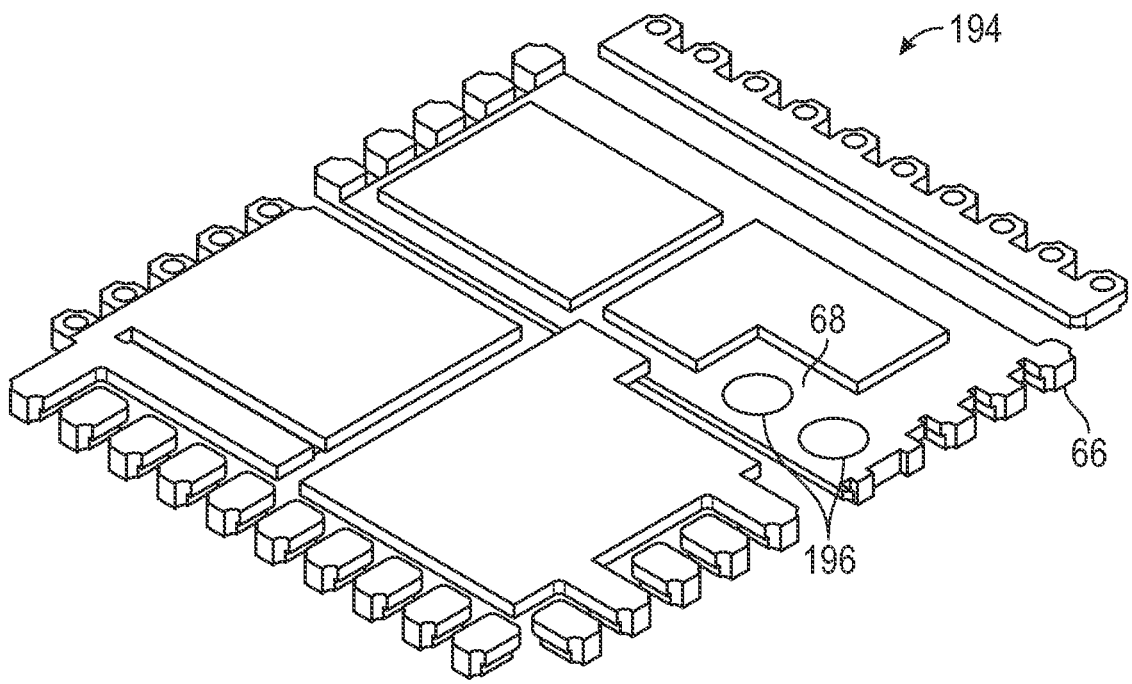
FIG. 14 is a top perspective view of an assembly formed during the formation of the package of FIG. 2.
Figure 15:
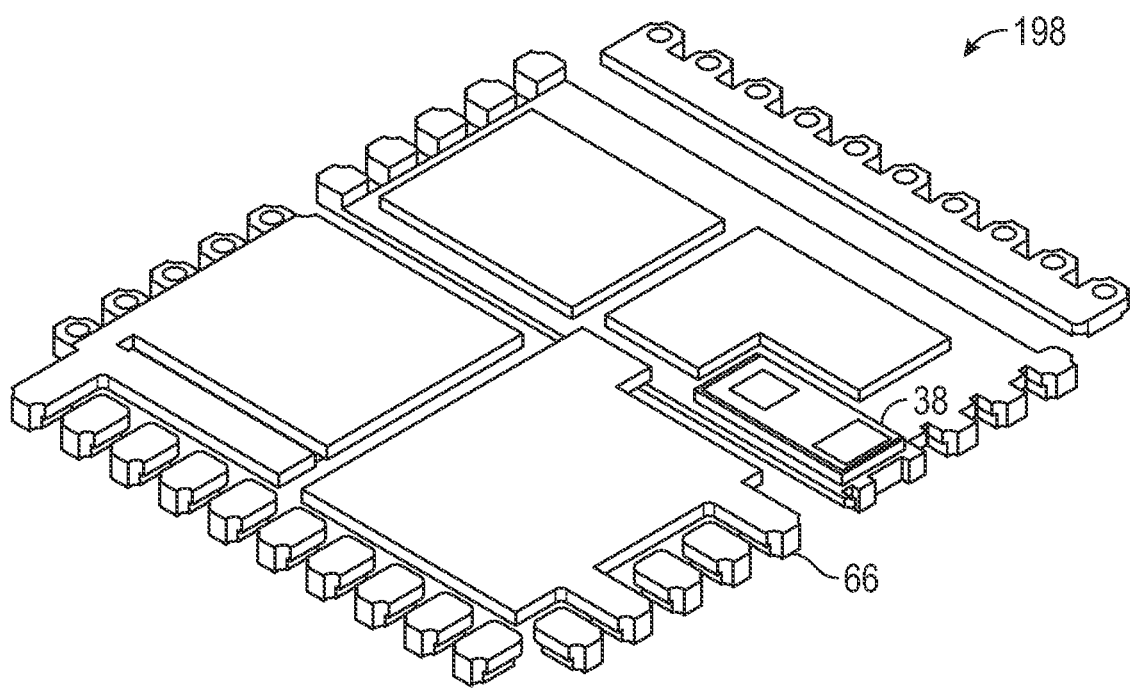
FIG. 15 is a top perspective view of an assembly formed during the formation of the package of FIG. 2.

Referring to FIGS. 14-21, an implementation of package 2 at various points in a method of manufacturing the package is illustrated (each intermediary step is called an assembly). The lead frame is seen to have defined contact pads for die connections as well as recess 68 which in the drawings is a half-etched recess. FIG. 14 shows assembly 194 which includes lead frame 66 and a bond material 196 disposed within the half-etched recess 68. The bond material may be, by non-limiting example, an adhesive, a die attach material, a die attach film, a solder, or other material capable of holding the interposer in place, and is disposed into the location where the interposer will be positioned. FIG. 15 shows assembly 198 after the interposer 38 has been positioned within the recess on the bond material 196. This may be followed with a solder reflow step (when the bond material is a solder) or an adhesive cure step (when the bond material is an adhesive) in various implementations.

Figure 16:
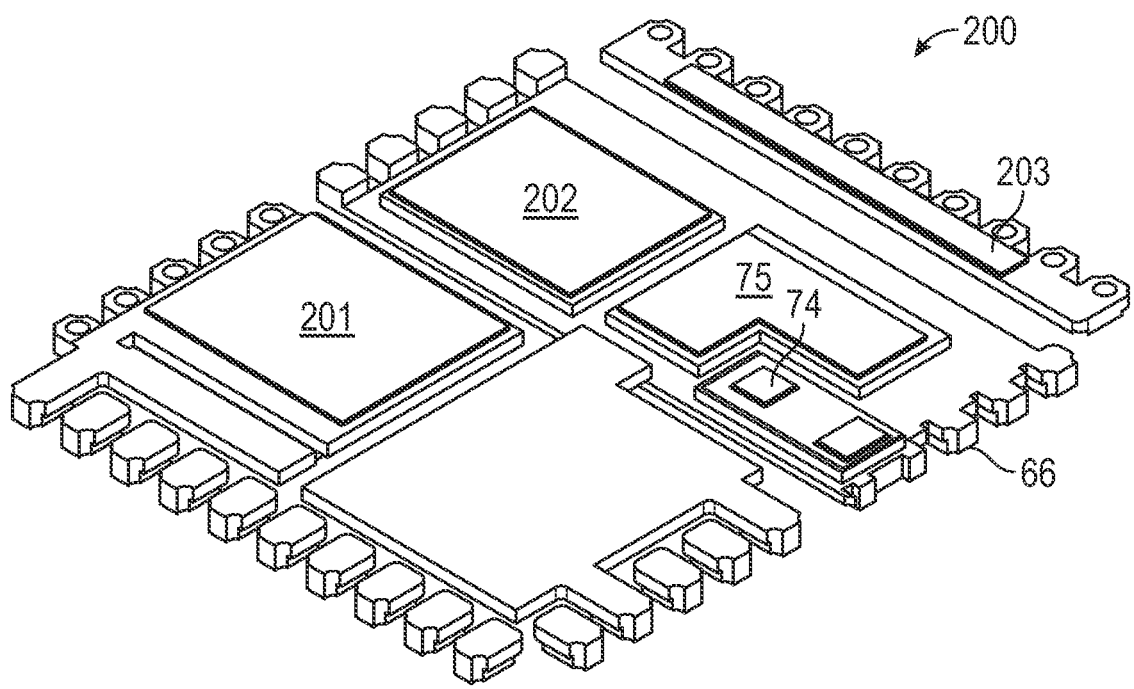
FIG. 16 is a top perspective view of an assembly formed during the formation of the package of FIG. 2.
Figure 17:
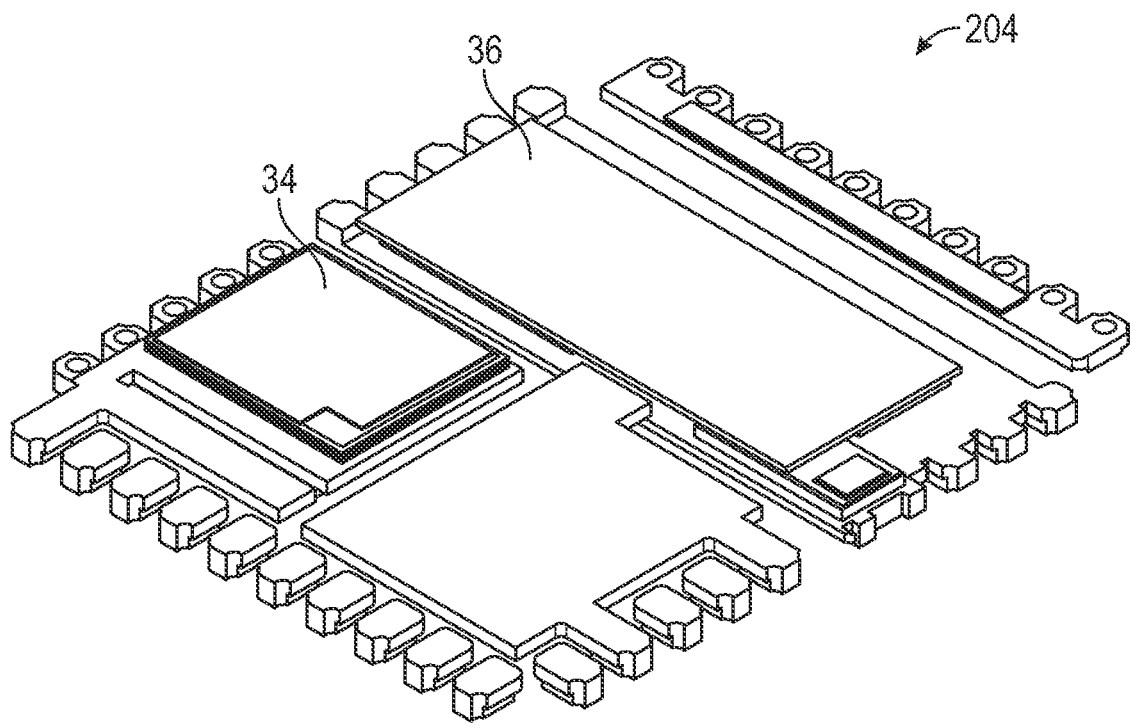
FIG. 17 is a top perspective view of an assembly formed during the formation of the package of FIG. 2.
Figure 18:
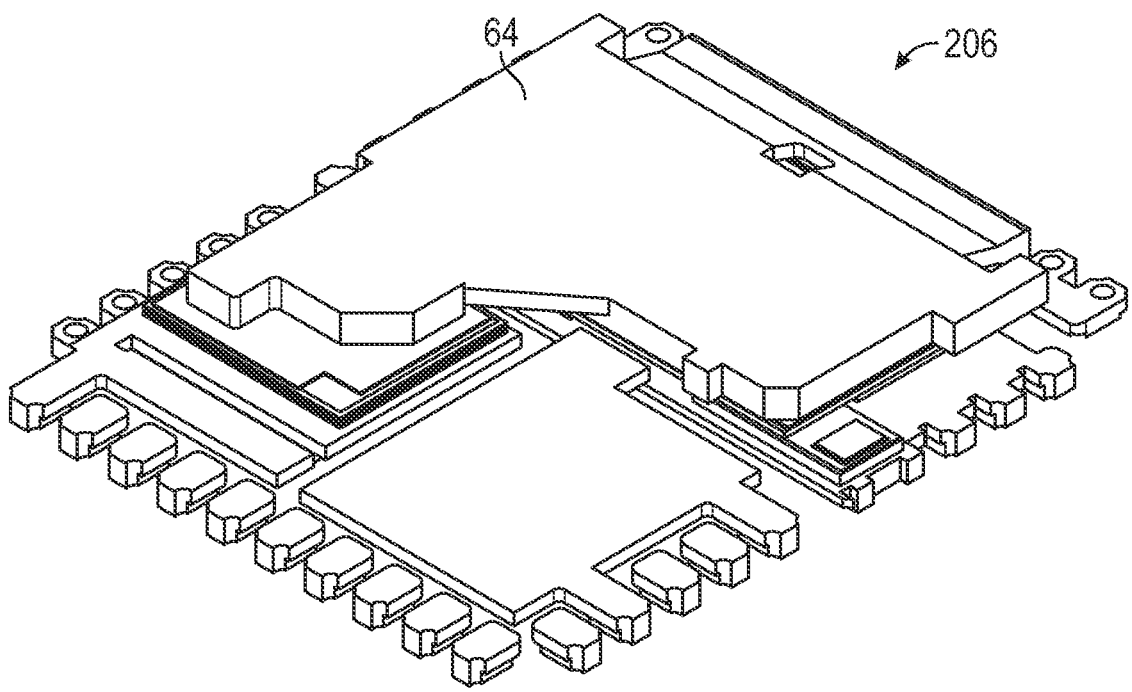
FIG. 18 is a top perspective view of an assembly formed during the formation of the package of FIG. 2.

Referring to FIG. 16, assembly 200 is illustrated with solder 201, solder 202, solder 203, layer 74, and layer 75 deposited in the shown locations (which may be printed on, in implementations)—these will be used to attach the LS MOSFET and HS MOSFET to the lead frame, to attach the LS MOSFET to the interposer, and to attach the SW clip to the lead frame. In FIG. 17 assembly 204 illustrates the LS MOSFET 36 and HS MOSFET 34 attached. Referring to FIG. 18, assembly 206 illustrates the SW clip (drain clip) 64 attached (this may also include coupling the SW clip with the HS MOSFET and LS MOSFET with solder or electrically conductive tape or the like, not shown). This may be followed by a flux cleaning process in various implementations.

Figure 19:
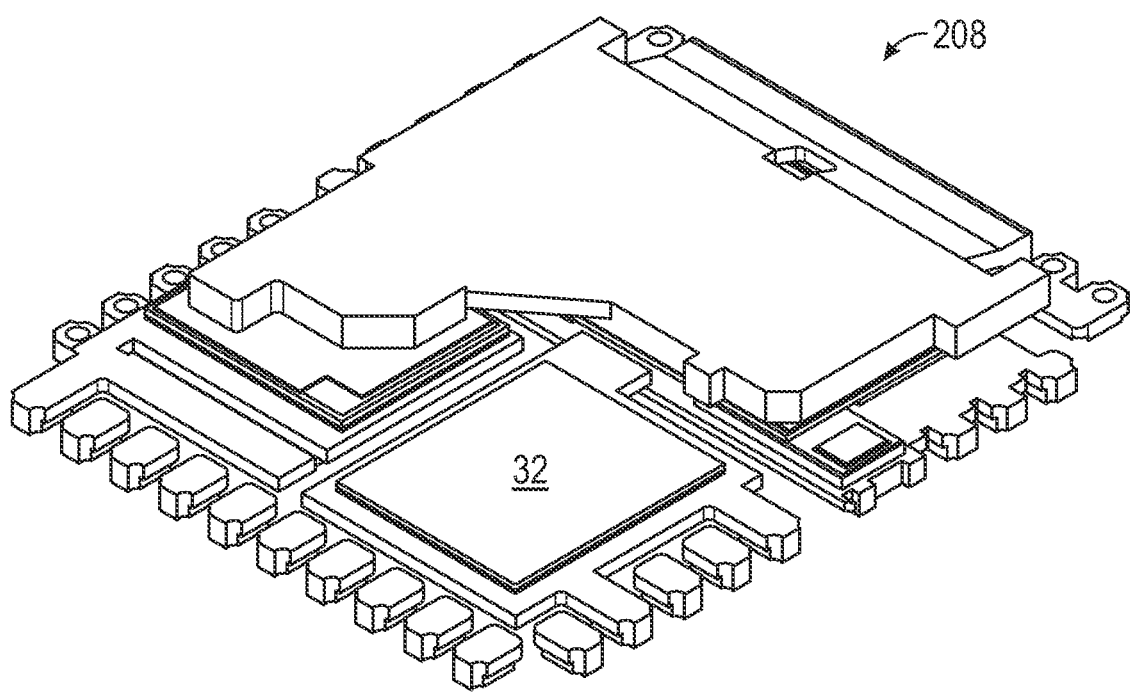
FIG. 19 is a top perspective view of an assembly formed during the formation of the package of FIG. 2.
Figure 20:
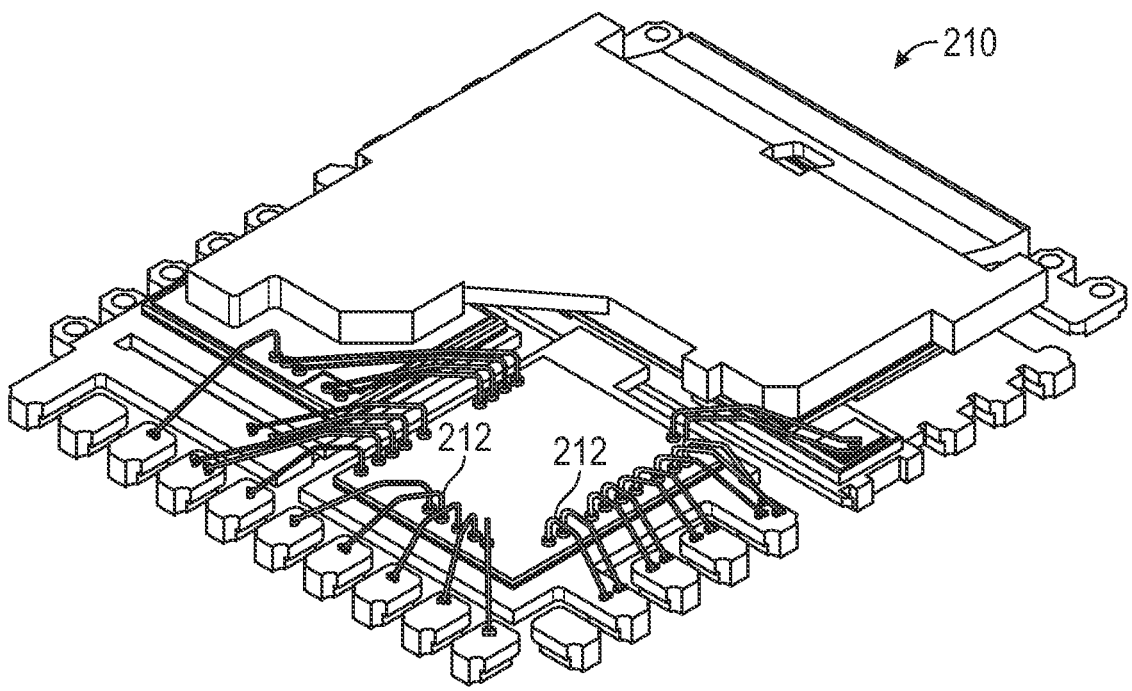
FIG. 20 is a top perspective view of an assembly formed during the formation of the package of FIG. 2.

Referring to FIG. 19, assembly 208 illustrates the driver 32 attached (which may be done using a solder, an adhesive, a tape, or any other die attach material process/material disclosed herein. In particular implementations, an adhesive is used and an adhesive cure process is performed after the driver is situated, followed by a plasma clean. FIG. 20 illustrates assembly 210 with wirebonds 212 coupling the driver with leads and with one of the pads of the interposer, as well as coupling the HS MOSFET with a lead and with the driver. In various implementations wirebonds are applied using thermosonic wirebonding. Following the wirebonding, a molding step is then carried out followed by a singulation process to separate various die from each other by cutting through the lead frame. In the implementations illustrated, the method uses a saw singulation process though many other singulation processes could be used in various implementations including laser, water jet cutting, plasma etching, or chemical etching.

Figure 21:
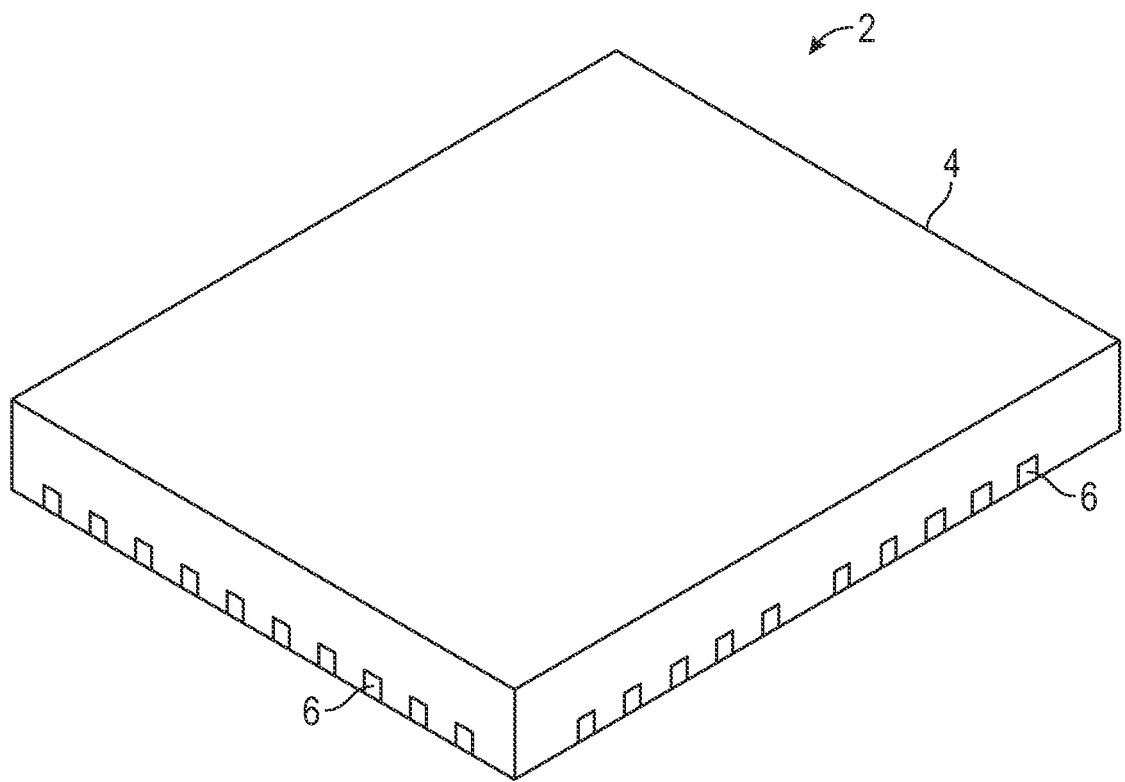
FIG. 21 is a top perspective view of the package of FIG. 2.

Referring to FIG. 21, shows the completed singulated package 2 which shows the encapsulant 4 and leads 6 exposed through the encapsulant. Following singulation, the device then proceeds through a package marking operation and then onto test and other finish operations. While a particular method implementation is illustrated in FIGS. 14-21, a wide variety of other method steps may be employed to form each of the various interposer-containing packages disclosed herein including, by non-limiting example, layer forming steps, metal plating steps, etching steps, bonding steps, curing steps, or any other process steps needed to form a particular structure.

The use of interposers which include an electrically insulative material and an electrically conductive material allows the LS gate interconnect to be fully within the encapsulant, but electrically isolated from the leadframe. Mounting the bottom of the interposer on the source terminal, but electrically isolated from it, allows for the maximizing of the LSS/PGND contact pad for better thermal dissipation to a PCB. Using an electrically insulative material as part of the interposer prevents leakage when the device/package is on, and allows for a more simplified trace layout design for the PCB itself (since no traces are needed for gate leads).

The methods disclosed herein can allow for the elimination of the GL pins without using through-silicon vias (TSVs) from the source side to the drain side of the LS MOSFET die.

Any of the individual semiconductor die discussed herein may also be referred to as a chip, such as a MOSFET chip, a transistor chip, a driver chip, and so forth.

In places where the description above refers to particular implementations of concealed gate terminal semiconductor packages and related methods and implementing components, sub-components, methods and sub-methods, it should be readily apparent that a number of modifications may be made without departing from the spirit thereof and that these implementations, implementing components, sub-components, methods and sub-methods may be applied to other concealed gate terminal semiconductor packages and related methods.

What is claimed is:

1. A semiconductor package comprising:
   a lead frame;
   one or more semiconductor die coupled with the lead frame; and
   an interposer coupled with the lead frame and with at least one of the one or more semiconductor die;
   wherein the interposer comprises an electrically conductive material on a first side of the interposer and an electrically insulative material on a second side of the interposer;
   wherein the interposer is coupled with the lead frame through the electrically insulative material such that the electrically conductive material is electrically isolated from the lead frame; and
   wherein the electrically conductive material forms at least two separated contact pads.

2. The package of claim 1, wherein the at least two separated contact pads are separated using one of a recess or a raised portion.

3. The package of claim 1, wherein the interposer is coupled with the lead frame using one of an adhesive, an epoxy, and a solder.

4. The package of claim 1, wherein the electrically insulative material comprises one of silicon, polyimide, an epoxy, a mold compound, and a ceramic.

5. The package of claim 1, wherein the electrically conductive material comprises a copper slug.

6. The package of claim 1, wherein the interposer comprises a flexible tape.

7. The package of claim 1, wherein the interposer comprises a flexible printed circuit board.

8. The package of claim 1, wherein the interposer comprises a molded integrated substrate.

9. The package of claim 1, wherein at least one gate node of a transistor of the one or more semiconductor die is fully enclosed within an encapsulant of the package without the gate node being exposed through the encapsulant.

10. The package of claim 9, wherein a source pad of the package is exposed through the encapsulant and is electrically coupled with a source node of the transistor.

11. The package of claim 1, wherein the at least two separated contact pads are separated using an electrically insulative layer coupled over the electrically conductive material.

12. The package of claim 1, wherein a gate node of one of the one or more semiconductor die is electrically coupled with a driver of the one or more semiconductor die without using a through-silicon via (TSV).

13. A method of forming a semiconductor package comprising:
   providing a lead frame;
   coupling one or more semiconductor die with the lead frame;
   mechanically coupling an interposer with the lead frame and electrically coupling the interposer with at least one of the one or more semiconductor die;
   at least partially enclosing the lead frame with an encapsulant, the one or more semiconductor die and the interposer within the encapsulant forming an unsingulated array; and
   singulating the array to form a semiconductor package;
   wherein the interposer comprises an electrically conductive material on a first side of the interposer and an electrically insulative material on a second side of the interposer;
   wherein the interposer is coupled with the lead frame through the electrically insulative material such that the electrically conductive material is electrically isolated from the lead frame; and
   wherein the electrically conductive material forms two separated contact pads.

14. The method of claim 13, wherein the interposer is fully enclosed within the encapsulant without being exposed through the encapsulant after singulation.

15. The method of claim 13, further comprising fully enclosing at least one gate node of a transistor of the one or more semiconductor die within the encapsulant without the at least one gate node being exposed through the encapsulant after singulation.

16. The method of claim 13, further comprising exposing a source pad through the encapsulant, the source pad electrically coupled with a source node of a transistor.

17. The method of claim 13, further comprising electrically coupling a gate node of the one or more semiconductor die with a driver of the one or more semiconductor die without using a through-silicon via (TSV).

18. A semiconductor package comprising:
   a lead frame;
   at least one transistor coupled with the lead frame;
   at least one driver coupled with the lead frame;
   an electrical interconnect electrically interconnecting the at least one driver with a gate node of the at least one transistor using an interposer comprising an electrically conductive material; and
   an encapsulant at least partially encapsulating the lead frame, the at least one transistor, the at least one driver, and the electrical interconnect;
   wherein the gate node is fully encapsulated by the encapsulant; and
   wherein the electrically conductive material comprises two separated contact pads.

19. The package of claim 18, wherein the interposer further comprises an electrically insulative material coupled with the electrically conductive material, wherein the at least one driver is electrically coupled with the gate node through the electrically conductive material, and wherein the electrically insulative material electrically insulates the electrically conductive material from the lead frame.

20. The package of claim 18, wherein the at least two separated contact pads are separated using one of an electrically insulative layer coupled over the electrically conductive material or a recess formed within the electrically conductive material.

* * * * *